United States Patent [19]

Kawai et al.

[11] Patent Number: 5,100,504
[45] Date of Patent: Mar. 31, 1992

[54] METHOD OF CLEANING SILICON SURFACE

[75] Inventors: Kenji Kawai; Toshiaki Ogawa, both of Hyogo, Japan

[73] Assignee: Mitsubishi Denki Kabushiki Kaisha, Tokyo, Japan

[21] Appl. No.: 668,677

[22] Filed: Mar. 7, 1991

Related U.S. Application Data

[63] Continuation of Ser. No. 379,390, Jul. 13, 1989, abandoned.

[30] Foreign Application Priority Data

Jul. 29, 1988 [JP] Japan .................. 63-191361
Jan. 13, 1989 [JP] Japan .................. 1-6828

[51] Int. Cl.⁵ .................. H01L 21/306
[52] U.S. Cl. .................. 156/643; 156/646; 156/653
[58] Field of Search .................. 156/643, 646, 653, 657

[56] References Cited

U.S. PATENT DOCUMENTS

| | | | |
|---|---|---|---|
| 4,028,155 | 6/1977 | Jacob | 156/659.1 |
| 4,680,086 | 7/1987 | Thomas et al. | 156/643 |
| 4,711,698 | 12/1987 | Douglas . | |
| 4,784,720 | 11/1988 | Douglas | 156/643 |

FOREIGN PATENT DOCUMENTS

| | | | |
|---|---|---|---|
| 57-181376 | 11/1982 | Japan | 156/643 |
| 59-34633 | 2/1984 | Japan | 156/643 |

OTHER PUBLICATIONS

Whitcomb, Selective, Anisotropic Etching of SiO₂ and PSG, May 9–14, 1982, Conference Abstract, Electrochemical Society, Montreal, Canada, pp. 339–340.
7th Symposium on Dry Process, Institute of Electrical Engineers, Oct. 1985, "Si Surface Treatment Using Deep UV Irradiation".
The Dictionary of Super-LSI, Science Form Company, Ltd., Mar. 31, 1988, p. 677 (English language translation).
Appl. Phys. Lett. 46 (6), 15 Mar. 1985, p. 589.
"The Removal Method of Carbon Contamination by R.I.E.", Extended Abstracts (The 48th Autumn Meeting, 1987) of The Japan Society of Applied Physics, No. 2, 19a-M-7, p. 562.

Primary Examiner—Richard V. Fisher
Assistant Examiner—John J. Bruckner
Attorney, Agent, or Firm—Lowe, Price, LeBlanc & Becker

[57] ABSTRACT

In the first step, a silicon oxide film (21) on a silicon surface (22) is etched away using a $CHF_3$ gas. After the silicon oxide film is removed, organic matter (23) of the $C_xF_y$ group remains on the silicon surface. In the second step, the organic matter (23) is etched away using a $NF_3$ gas. The silicon oxide film (21) is etched in preference to underlying silicon (22) by using the $CHF_3$ gas. A F radical is easily formed from the $NF_3$ gas used for removing the organic matter (23). At the time of forming this F radical, no residue is formed which makes the silicon surface (22) dirty. Consequently, a clear silicon surface (22) is obtained.

8 Claims, 6 Drawing Sheets

PRIOR ART

METHOD OF CLEANING SILICON SURFACE

This application is a continuation application of application Ser. No. 07/379,390, filed July 13, 1989 now abandoned.

BACKGROUND OF THE INVENTION

1. Field of the Invention

The present invention relates generally to a method of processing a silicon surface, and more particularly, to a method of etching away organic matter on a silicon surface which remains after etching away a silicon oxide film on the silicon surface.

2. Description of the Background Art

In order to fabricate a reliable semiconductor device, it is necessary to satisfactorily control an interface structure of a silicon substrate and a thin film formed on the surface of the silicon substrate. It is known that a natural oxide film is formed on a silicon surface if silicon is left in an atmosphere including oxygen. Thus, this natural oxide film must be removed before fabricating the semiconductor device.

Furthermore, the process for fabricating a semiconductor device comprises the step of forcing a silicon oxide film to be formed on a silicon surface and then, removing only a desired silicon oxide film, to form a circuit pattern.

Conventionally, the above described natural oxide film and silicon oxide film (referred to as silicon oxide film hereinafter) have been etched away using a $CHF_3$ gas or etched away using the mixed gas of $C_mF_n$ and $H_2$. The reason is that the silicon oxide film is etched in preference to underlying silicon by using the gases. The reason why the underlying silicon is not easily etched is that $CH_3^+$ generated in plasma does not easily react with silicon so that a silicon surface is covered with organic matter of the $C_xF_y$ group.

In particular, it is known that the higher the m:n ratio of $C_mF_n$ becomes, the more easily the silicon oxide film is etched when the mixed gas of $C_xF_n$ and $H_2$ is used. In other words, as the m:n ratio becomes higher, the ratio of the etching rate of the silicon oxide film to the etching rate of silicon (the etching rate of the silicon oxide film/the etching rate of silicon) is improved.

However, if organic matter of the $C_xF_y$ group remains on the silicon surface, some problems occur. For example, electrical resistance is increased at the time of connecting an interconnection because the organic matter is an insulating material.

Additionally, an etching damage layer is formed on the silicon surface by etching the silicon oxide film. This etching damage layer leads to the decrease in the reliability of the semiconductor device.

A method of removing the organic matter of the $C_xF_y$ group and the etching damage layer on the silicon surface comprises a method of exciting a $Cl_2$ gas by ultraviolet rays to form a Cl radical and removing the organic matter and the etching damage layer by the Cl radical. The method is described in, for example, pages 25 to 29 of the documents distributed in the 7th Symposium on Dry Process which is sponsored by Institute of Electrical Engineers in October, 1985, entitled as "Si Surface Treatment Using Deep UV Irradiation".

However, considering a case in which the organic matter of the $C_xF_y$ group and the etching damage layer are removed and then, an aluminum interconnection is provided on the silicon surface, if the $Cl_2$ gas remains on the silicon surface provided with the Al interconnection in extremely small quantities, aluminum is corroded. Thus, etching using the $Cl_2$ gas may lead to the decrease in the reliability of the aluminum interconnection.

Furthermore, the method of removing the organic matter of the $C_xF_y$ group and the etching damage layer on the silicon surface comprises a method using $O_2$ plasma and wet processing. The method is described in, for example, an article entitled "The removal method of carbon contamination by R.I.E." in Extended Abstracts (The 48th Autumn Meeting, 1987) of The Japan Society of Applied Physics, No. 2, 19a-M-7, pp. 562.

However, by using the $O_2$ plasma, a silicon oxide film is formed on the silicon surface after removing the organic matter of the $C_xF_y$ group and the etching damage layer. On the other hand, by using the wet processing, the etching rate is increased, so that it is difficult to control etching.

Additionally, there is a method of removing a silicon oxide film from a silicon surface without leaving organic matter on the silicon surface. The method is a method of etching using a $NF_3$ gas. For example, such a method is described in U.S. Pat. No. 4,711,698.

In this method, N which is not used for etching becomes $N_2$ so that a residue is not left on the silicon surface.

However, by using the $NF_3$ gas, the ratio of the etching rate of the silicon oxide film to the etching rate of silicon (the ratio of selection = the etching rate of the silicon oxide film/the etching rate of silicon) approaches 1. Therefore, the silicon and the silicon oxide film are etched by the same amount.

Thus, if there is imbalance in thickness of the silicon oxide film formed on the silicon surface, the following problems occur. A thin portion of the silicon oxide film is removed earlier than a thick portion of the silicon oxide film. Thus, underlying silicon is etched in the thin portion of the silicon oxide film until the thick portion of the silicon oxide film is removed. In particular, if there is an active region formed by implanting B or the like on the silicon surface in the thin portion of the silicon oxide film, even the active region is etched. Consequently, operating characteristics of the semiconductor device are adversely affected.

Conventionally, the organic matter and the etching damage layer remaining on the silicon surface have been etched using a gas such as $CF_4$ and $SF_6$ after removing the silicon oxide film. In this etching processing, the gas such as $CF_4$ and $SF_6$ is dissociated to form a F radical, and the organic matter and the etching damage layer are removed by this F radical. The organic matter is removed by reaction with the F radical. In addition, the F radical passes through the organic matter to react with silicon, thereby to form $SiF_4$. The organic matter and the etching damage layer on the silicon surface are destroyed by $SiF_4$ formed in the above described manner, to be removed.

Referring to the drawings, description is made of the conventional processing of etching away a silicon oxide film on a silicon substrate and further etching away organic matter and an etching damage layer remaining after the etching. FIG. 5 is a diagram showing the steps of such processing. FIGS. 6A to 6D are diagrams showing a state of a silicon substrate in respective steps.

As shown in FIG. 6A, a silicon substrate 2 having a $SiO_2$ film 1 formed thereon is first prepared.

As shown in FIG. 6B, $CF_3^-$ formed by dissociating a $CHF_3$ gas is then supplied to the silicon substrate 2 having the $SiO_2$ film 1 formed thereon.

As shown in FIG. 6C, the $SiO_2$ film 1 is removed. Alternatively, organic matter 3 of the $C_xF_y$ group and an etching damage layer 4 remain.

Then, as shown in FIG. 6D, a F* (F radical) formed by dissociating a $SF_6$ gas is supplied to the silicon substrate 2 on which the organic matter 3 of the $C_xF_y$ group and the etching damage layer 4 remain, to remove the organic matter 3 of the $C_xF_y$ group and the etching damage layer 4 from the silicon substrate.

However, the conventional etching using an etching gas such as $CF_4$ and $SF_6$ has the disadvantage in that a compound of carbon fluoride, sulfide or the like which is liberated simultaneously with formation of the F radical is deposited on a silicon surface, so that the silicon surface cannot be cleanly processed.

SUMMARY OF THE INVENTION

An object of the present invention is to provide a method in which a silicon oxide film on a silicon surface can be cleanly removed without leaving a residue on the silicon surface.

Another object of the present invention is to provide a method in which an etching damage layer on a silicon surface which is formed by etching, together with a silicon oxide film formed on the silicon surface, can be removed.

Still another object of the present invention is to provide a method in which a silicon oxide film formed on a silicon surface can be removed without etching underlying silicon even if there is imbalance in the thickness of the silicon oxide film.

A further object of the present invention is to provide a silicon oxide film removing method in which the increase in electrical resistance in a contact portion of a silicon surface and an interconnection layer formed thereon can be controlled.

A still further object of the present invention is to provide a silicon oxide film removing method in which corrosion relative to an aluminum interconnection layer formed on a silicon surface can be prevented.

The present invention is directed to a method of etching away a silicon oxide film formed on a silicon surface. First, the silicon oxide film on the silicon surface is etched away using a predetermined gas. The predetermined gas comprises a gas for leaving organic matter on the silicon surface. Therefore, the organic matter remains on the silicon surface after removing the silicon oxide film. The organic matter remaining on the silicon surface is removed by etching using at least one of a $NF_3$ gas and a $F_2$ gas.

Using the $NF_3$ and $F_2$ gas used as an etching gas in the present invention, a residue which makes the silicon surface dirty is not formed in forming a F radical.

Furthermore, bond energy of N-F and F-F is smaller than that of C-F or S-F. Thus, a $NF_3$ gas and a $F_2$ gas forms the F radical more easily than the conventional gas such as a $CF_4$ gas and a $SF_6$ gas. Thus, the organic matter on the silicon surface can be easily removed.

Additionally, considering a case in which an aluminum interconnection is provided on the silicon surface after removing the organic matter on the silicon surface, even if $NF_3$ and $F_2$ remain on the silicon surface provided with the aluminum interconnection, aluminum is not corroded by $NF_3$ and $F_2$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
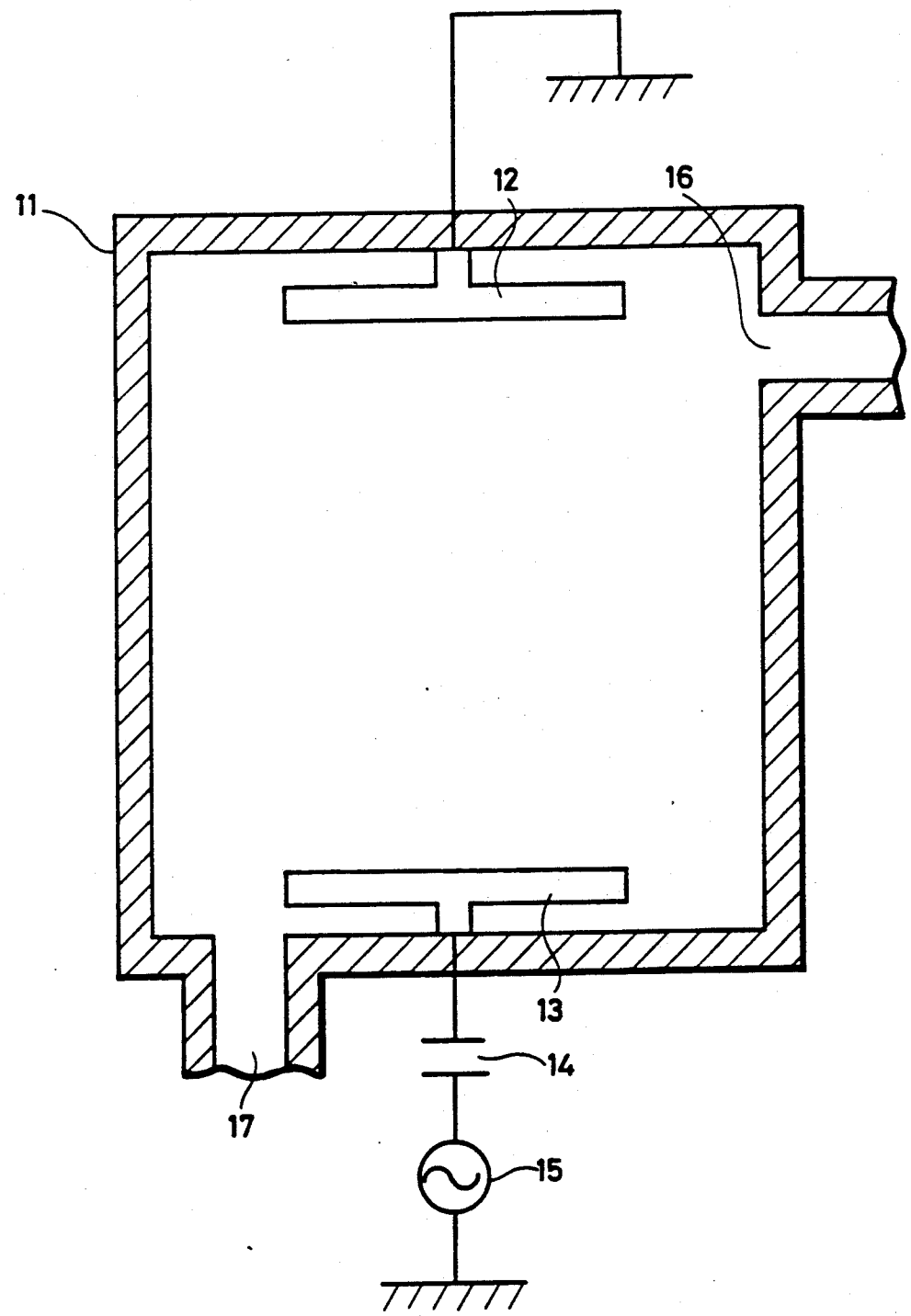
FIG. 1 is a schematic diagram showing a structure of a parallel plate type etching apparatus which is one example of an apparatus employed in the embodiment of the present invention.

An embodiment of the present invention will be described. FIG. 1 is a schematic diagram showing a structure of a parallel plate type etching apparatus which is one example of an apparatus employed in the embodiment of the present invention.

As shown in FIG. 1, high-frequency electrodes 12 and 13 are respectively provided in the upper portion and the lower portion of an etching reaction chamber 11, the high-frequency electrodes 12 and 13 being located opposed to each other. A sample having a silicon surface such as a silicon wafer is placed on the high-frequency electrode 12.

The high-frequency electrode 12 is grounded. The high-frequency electrode 13 is connected to a high-frequency oscillator 15 through a capacitor 14. The high-frequency oscillator 15 is grounded.

A gas inlet 16 and a gas outlet 17 are respectively provided in the side portion and the lower portion of the etching reaction chamber 11. The gas inlet 16 and the gas outlet 17 are provided in a position where gas flows between the high-frequency electrodes 12 and 13.

Figure 2:
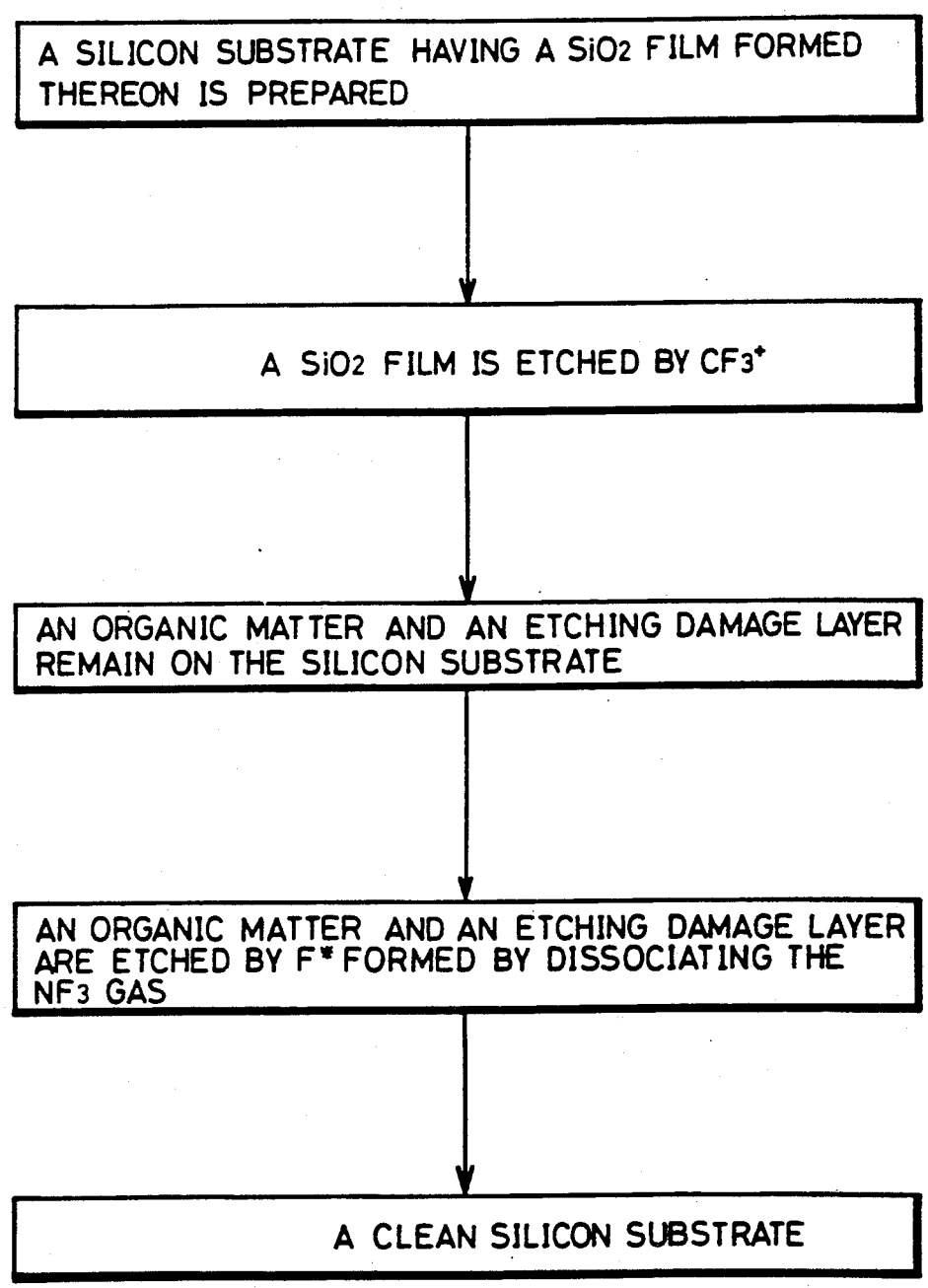
FIG. 2 is a diagram showing the steps for explaining an embodiment of the present invention.

Description is now made of processing of etching away a silicon oxide film on a silicon surface using the parallel plate type etching apparatus shown in FIG. 1 and further etching away organic matter and an etching damage layer remaining after the etching. FIG. 2 is a diagram showing the steps of such processing. FIGS. 3A to 3E are diagrams showing a state of a silicon substrate in respective steps.

Figure 3A:
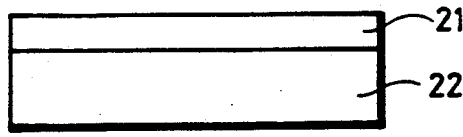
FIGS. 3A to 3E are diagrams showing a state of a silicon substrate in respective steps shown in FIG. 2.

First, as shown in FIG. 3A, a silicon substrate 22 having a $SiO_2$ film 21 formed thereon is prepared. The Si substrate 22 is placed on the high-frequency electrode 13 of the parallel plate type etching apparatus shown in FIG. 1.

Figure 3B:
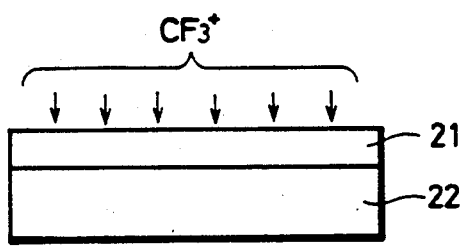

High-frequency electric power is then applied to the high-frequency electrodes 12 and 13 by the high-frequency oscillator 15, to generate plasma. At the same time, a $CHF_3$ gas is introduced into the etching reaction chamber 11 from the gas inlet 16. Consequently, the $CHF_3$ gas is dissociated, so that $CF_3^+$ is formed. As shown in FIG. 3B, $CF_3^+$ is supplied to the Si substrate 22 having the $SiO_2$ film 21 formed thereon.

Figure 3C:

As shown in FIG. 3C, the SiO$_2$ film is removed from the silicon substrate 22. Alternatively, organic matter 23 of the C$_x$F$_y$ group remains. In addition, an etching damage layer 24 by this etching is formed on the surface of the silicon substrate 22.

The foregoing etching processing is all the same as that in the conventional example and hence, etching conditions thereof are the same as those in the conventional example.

A N$_2$ gas which is an inert gas is then introduced into the etching reaction chamber 11 from the gas inlet 16. Consequently, the CHF$_2$ gas remaining in the etching reaction chamber 11 is exhausted from the gas outlet 17.

Figure 3D:
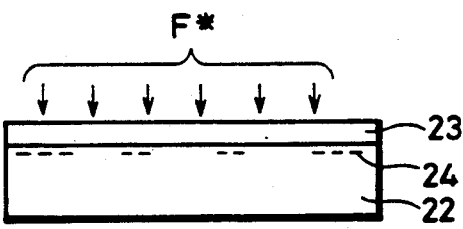

Then, high-frequency electric power of 13.56 MHz and 0.15 W/cm$^2$ is applied to the high-frequency electrodes 12 and 13 by the high-frequency oscillator 15, to produce plasma. In addition, the mixed gas made at a ratio of NF$_3$ 5 sccm to He 200 sccm is introduced into the etching reaction chamber 11 from the gas inlet 16. The pressure of the etching reaction chamber 11 is set to 300 mTorr. A period during which the high-frequency electric power is applied is 30 seconds. In the present embodiment, in order to bring about the stability of the NF$_3$ gas, the He gas is mixed with the NF$_3$ gas, to decrease the etching rate. NF$_3$ is dissociated in plasma produced in the above described manner, so that a F radical is formed. This F radical is supplied to the silicon substrate 22 where the organic matter 23 of the C$_x$F$_y$ group and the etching damage layer 24 remain, as shown in FIG. 3D.

Figure 3E:
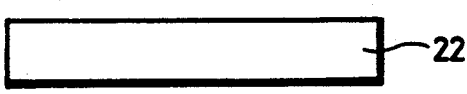

As shown in FIG. 3E, the organic matter 23 and the etching damage layer 24 are removed from the silicon substrate 22. The removed organic matter or the like is exhausted from the gas outlet 17.

When the silicon surface after removing the organic matter or the like is observed using X-ray electron spectroscopy, the deposit of a residue is not recognized, so that it is confirmed that a clean silicon surface is obtained.

Meanwhile, the etching rate can be controlled by changing the amount of the inert gas added to the NF$_3$ gas as described above.

In the above described embodiment, etching of the silicon oxide film on the silicon surface and etching of the organic matter or the like remaining on the silicon surface after removing the silicon oxide film are made in the same reaction chamber. However, the etching can be made in different reaction chambers. For example, etching of the silicon oxide film on the silicon surface can be made by a parallel plate type etching apparatus, and etching of the organic matter and the etching damage layer remaining on the silicon surface after removing the silicon oxide film can be made by a photo chemical type etching apparatus.

Figure 4:
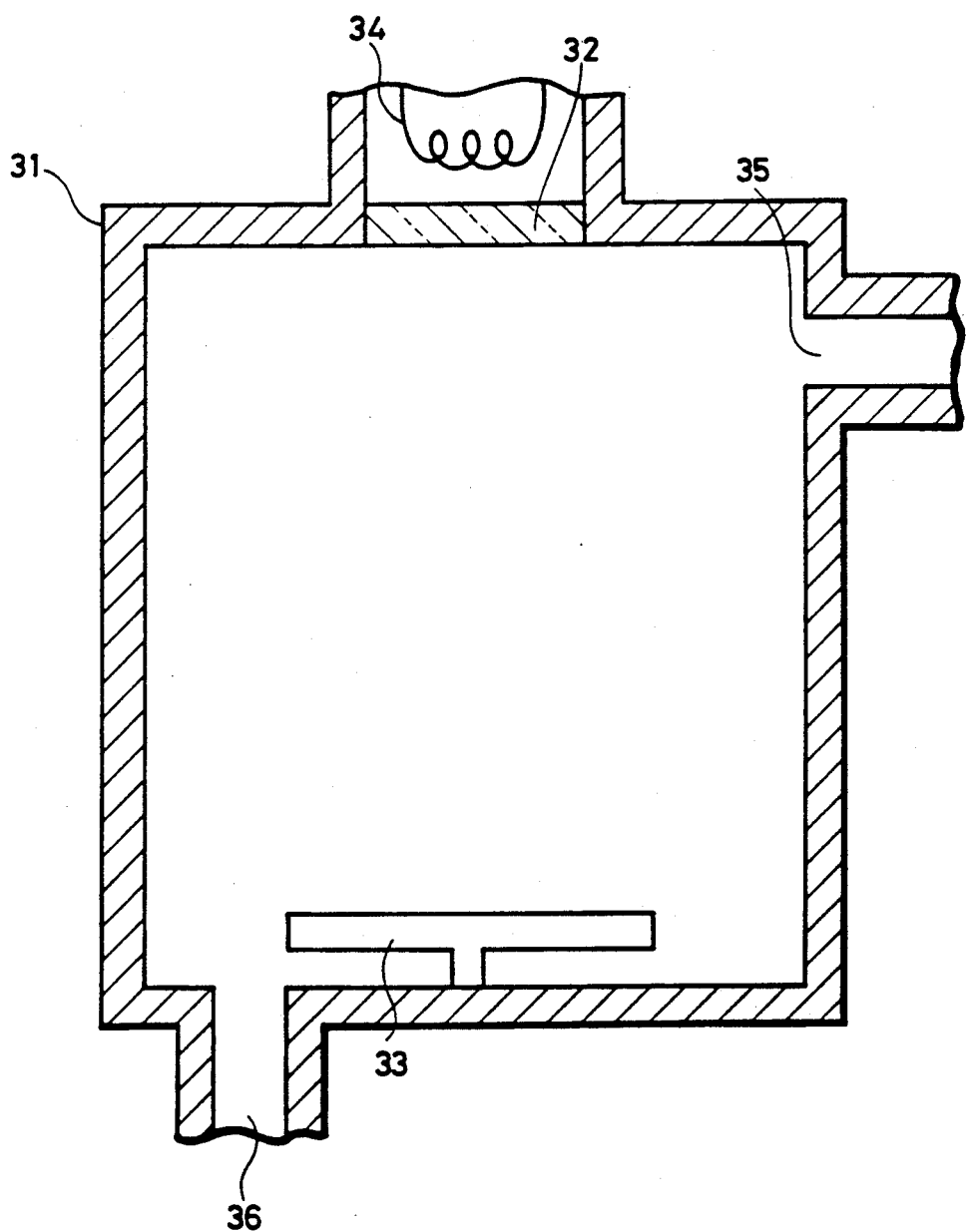
FIG. 4 is a schematic diagram showing a structure of a photo chemical type etching apparatus which is one example of an apparatus employed in the embodiment of the present invention.
Figure 5:
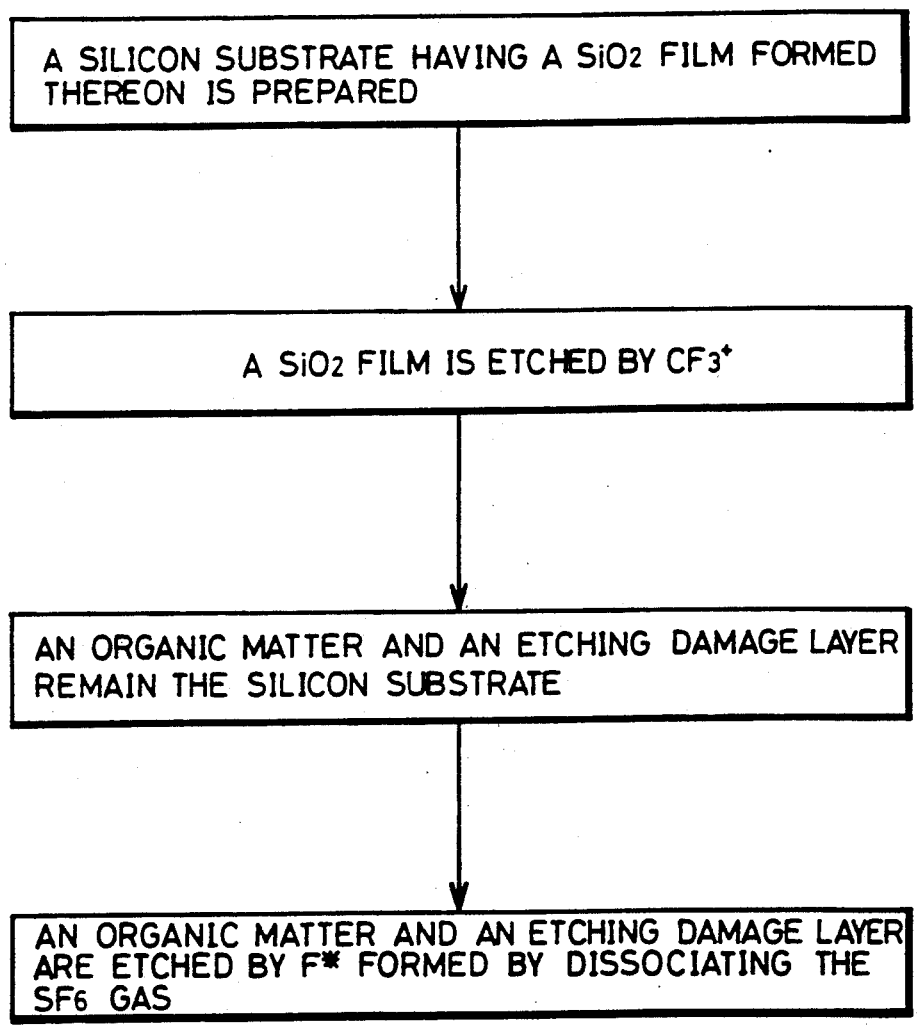
FIG. 5 is a diagram showing the steps of the conventional processing of a silicon surface.
Figure 6A:
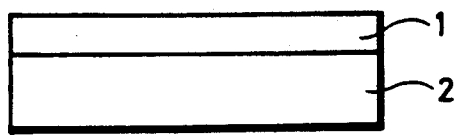
FIGS. 6A to 6D are diagrams showing a state of a silicon substrate in respective steps shown in FIG. 5.
Figure 6B:
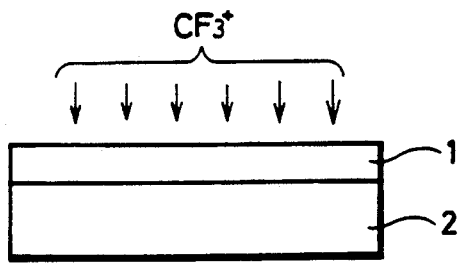
Figure 6C:
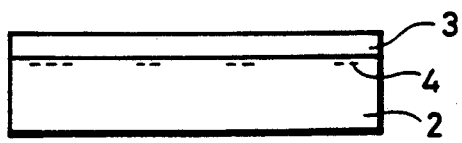
Figure 6D:
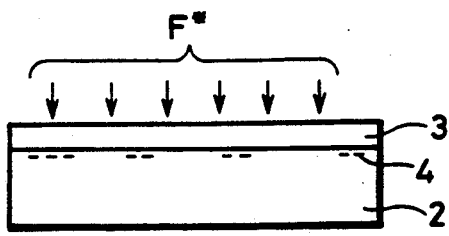

FIG. 4 is a schematic diagram showing a structure of the photo chemical type etching apparatus.

Referring to FIG. 4, a quartz window 32 on which ultraviolet rays are incident is provided in the upper portion of an etching reaction chamber 31. A sample supporting base 33 is provided opposed to the quartz window 32 in the lower portion of the etching reaction chamber 31. A sample having a silicon surface is placed on the sample supporting base 33. A low pressure mercury lamp 34 serving as a light source is provided on the quartz window 32.

A gas inlet 35 and a gas outlet 36 are respectively provided in the side portion and the lower portion of the etching reaction chamber 31. The gas inlet 35 and the gas outlet 36 are provided in a position where gas flows on the sample supporting base 33.

Description is now made of an embodiment of the present invention, using the parallel plate type etching apparatus and the photo chemical type etching apparatus.

First, the silicon substrate having the silicon oxide film formed thereon is placed on the high-frequency electrode 13 of the parallel plate type etching apparatus shown in FIG. 1.

A CHF$_3$ gas is then introduced into the etching reaction chamber 11 from the gas inlet 16. At the same time, high-frequency electric power is applied to the high-frequency electrodes 12 and 13 by the high-frequency oscillator 15, to produce plasma. Consequently, the CHF$_3$ gas is dissociated so that CF$_3^+$ is formed.

Then, the silicon oxide film is removed from the silicon substrate. Alternatively, organic matter of the C$_x$F$_y$ group remains on the silicon substrate. In addition, an etching damage layer by this etching can be formed on the surface of the silicon substrate.

The foregoing etching processing is the same as that in the conventional example and hence, etching conditions thereof are the same as those in the conventional example.

Then, the silicon substrate having the organic matter and the etching damage layer is placed on the sample supporting base 33 of the photo chemical type etching apparatus shown in FIG. 4.

Then, the gas is exhausted from the etching reaction chamber 31 to $5 \times 10^{-8}$ Torr and then, a NF$_3$ gas is introduced from the gas inlet 35, to set the gas pressure to 500 mTorr. Ultraviolet rays of a wavelength of 184.9 nm are irradiated by the low pressure mercury lamp 34. In this embodiment, etching is made using only the NF$_3$ gas without mixing an inert gas with the NF$_3$ gas. The organic matter and the etching damage layer are removed by a F radical formed by dissociating the NF$_3$ gas. The removed organic matter and the like are exhausted from the gas outlet 36. When the silicon surface after removing the organic matter or the like is observed using X-ray electron spectroscopy, it is confirmed that the deposit of a residue is not recognized so that a clean silicon surface is obtained.

As described in the foregoing, according to the present invention, the organic matter as well as the etching damage layer are removed. However, if the etching damage layer is not formed on the silicon surface in the step of removing the silicon oxide film on the silicon surface, the removal of the organic matter is sufficient in the subsequent steps.

Furthermore, although in the above described embodiment, the NF$_3$ gas is used as an etching gas, a F$_2$ gas may be used instead of the NF$_3$ gas, to obtain the same effect.

Additionally, although in the above described embodiment, photo chemical etching and reactive ion etching are illustrated, it should be noted that the present invention can be applied to other etching methods.

Although description was made of the embodiment of the present invention, there are the following manners in implementing the present invention:

(1) The step of removing the silicon oxide film and the step of removing the organic matter are achieved in the same reaction chamber. In this manner, the efficiency in fabricating a semiconductor device is improving. In addition, since the silicon surface after removing the silicon oxide film need not be exposed to an atmosphere including oxygen, a natural oxide film is not formed on the silicon surface after removing the silicon oxide film.

(2) In the above described manner (1), there is a step of introducing an inert gas into the reaction chamber and discharging a gas for removing the silicon oxide film outside of the reaction chamber between the step of removing the silicon oxide film and the step of removing the organic matter.

(3) In the above described manner (1), etching is made by reactive ion etching.

(4) The step of removing the silicon oxide film and the step of removing the organic matter are achieved in different reaction chambers. In this manner, the silicon oxide film and the organic matter can be respectively etched by the most preferable etching methods.

(5) IN the above described manner (4), the silicon oxide film is removed by reactive ion etching while the organic matter is removed by photo chemical etching.

(6) The silicon oxide film is removed using a gas by which the etching rate of the silicon oxide film becomes larger than the etching rate of silicon. In this manner, even if there is an imbalance in the thickness of the silicon oxide film, the underlying silicon is not easily etched after a thin portion of the silicon oxide film is etched, so that the underlying silicon is prevented from being excessively etched until etching of a thick portion of the silicon oxide film is completed.

(7) In the above described manner (6), a $CHF_3$ gas or the mixed gas of $C_mF_n$ and $H_2$ is used as a gas for removing the oxide film.

(8) An inert gas is mixed with a gas used for removing the organic matter so as to adjust the etching rate. In this manner, if a gas for, for example, removing the organic matter is to be stabilized, it is necessary to decrease the etching rate.

As described in the foregoing, according to the present invention, the organic matter remaining on the silicon surface after removing the silicon oxide film is etched away by at least one of a $NF_3$ gas and a $F_2$ gas. Therefore, a residue which makes the silicon surface dirty is not deposited on the silicon surface.

Furthermore, since using the $NF_3$ and $F_2$ gas, a F radical is formed more easily than using $CF_4$ and $SF_6$ conventionally used as an etching gas, the organic matter on the silicon surface can be removed more easily than the conventional example.

Additionally, considering a case in which an aluminum interconnection is provided on the silicon surface after removing the organic matter on the silicon surface, even if $NF_3$ and $F_2$ remain on the silicon surface provided with the aluminum interconnection, aluminum is not corroded by the materials such as $NF_3$ and $F_2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of removing a silicon oxide film (21) on a silicon surface (22) to obtain a clean surface, comprising the steps of:
    etching away the silicon oxide film (21) on the silicon surface (22) using a gas which leaves $C_xF_y$ organic matter (23) on said silicon surface (22) during said etching away, said gas having a silicon oxide etch rate which is greater than its silicon etch rate and consisting essentially of a $CHF_3$ gas or a mixed gas of $C_mF_n$ and $H_2$, and
    etching away said organic matter (23) remaining on the silicon surface using at least one of a $NF_3$ gas and a $F_2$ gas after removing said silicon oxide film (21).

2. The method according to claim 1, wherein the step of removing said silicon oxide film and the step of removing said organic matter are achieved in the same reaction chamber (11).

3. The method according to claim 2, wherein a step of introducing an inert gas into said reaction chamber (11) and discharging a gas for removing said silicon oxide film outside of said reaction chamber (11) is included between the step of removing said silicon oxide film and the step of removing said organic matter.

4. The method according to claim 2, wherein the etching conducted in said same reaction chamber (11) is reactive ion etching.

5. The method according to claim 1, wherein the step of removing said silicon oxide film and the step of removing said organic matter are achieved in different reaction chambers (11, 31).

6. The method according to claim 5, wherein said silicon oxide film is removed by reactive ion etching, and said organic matter is removed by photo chemical etching wherein irradiation of the at least one of a $NF_3$ gas and a $F_2$ gas causes dissociation of the at least one of a $NF_3$ gas and a $F_2$ gas.

7. The method according to claim 1, wherein an inert gas is mixed with a gas for removing said organic matter so as to adjust the etching rate.

8. A method of removing a silicon oxide film (21) on a silicon surface (22) to obtain a clean surface, comprising the steps of:
    etching away the silicon oxide film (21) on the silicon surface (22) using a gas which leaves $C_xF_y$ organic matter (23) on said silicon surface (22) during said etching away, said gas having a silicon oxide etch rate which is greater than its silicon etch rate and consisting essentially of a $CHF_3$ gas or a mixed gas of $C_mF_n$ and $H_2$, and
    etching away said organic matter (23) remaining on the silicon surface using a $F_2$ gas after removing said silicon oxide film (21).

* * * * *